(12) United States Patent
Padgett et al.

(10) Patent No.: US 12,427,624 B2
(45) Date of Patent: Sep. 30, 2025

(54) AUTOMATED VEHICLE COMPONENT CLEANING SYSTEM

(71) Applicant: Cummins Inc., Columbus, IN (US)

(72) Inventors: Melissa R. Padgett, Columbus, IN (US); Eric A. Cantrell, Greenwood, IN (US); Romaine O. Edwards, Greenwood, IN (US); Manoj M. Thete, Columbus, IN (US)

(73) Assignee: Cummins Inc., Columbus, IN (US)

( * ) Notice: Subject to any disclaimer, the term of this patent is extended or adjusted under 35 U.S.C. 154(b) by 723 days.

(21) Appl. No.: 17/611,735

(22) PCT Filed: May 15, 2020

(86) PCT No.: PCT/US2020/033166
§ 371 (c)(1),
(2) Date: Nov. 16, 2021

(87) PCT Pub. No.: WO2020/236606
PCT Pub. Date: Nov. 26, 2020

(65) Prior Publication Data
US 2022/0234169 A1    Jul. 28, 2022

Related U.S. Application Data

(60) Provisional application No. 62/849,539, filed on May 17, 2019.

(51) Int. Cl.
*B24C 1/00* (2006.01)
*B08B 3/02* (2006.01)
(Continued)

(52) U.S. Cl.
CPC .......... *B24C 1/003* (2013.01); *B08B 3/02* (2013.01); *B08B 5/02* (2013.01); *B08B 7/00* (2013.01); *B08B 13/00* (2013.01); *C23C 14/021* (2013.01)

(58) Field of Classification Search
None
See application file for complete search history.

(56) References Cited

U.S. PATENT DOCUMENTS

| | | |
|---|---|---|
| 2002/0128169 A1 | 9/2002 | Levitt |
| 2009/0211605 A1 | 8/2009 | Ahmad |

(Continued)

FOREIGN PATENT DOCUMENTS

| | | |
|---|---|---|
| CN | 205413724 | 8/2016 |
| CN | 210000291 U | 1/2020 |

(Continued)

OTHER PUBLICATIONS

Applied Surface Science, An environmentally friendly approach for contaminants removal using supercritical CO2 for remanufacturing industry, Dec. 3, 2013, pp. 142-248, Liu et al. (Year: 2013).*

(Continued)

*Primary Examiner* — Rita P Adhlakha
(74) *Attorney, Agent, or Firm* — Taft Stettinius & Hollister LLP

(57) ABSTRACT

A system is provided for performing a cleaning process of a component of a vehicle. The system includes a first cleaning applicator configured to deliver a cleaning agent to a first surface of the component of the vehicle, a second cleaning applicator configured to deliver the cleaning agent to a second surface of the component of the vehicle, a third cleaning applicator configured to deliver the cleaning agent to a third surface of the component of the vehicle, and a control unit configured to instruct each of the first, second, and third cleaning applicators to project the cleaning agent onto the respective surface of the component for a corresponding predetermined period. The first, second, and third applicators are instructed to project the cleaning agent in a predetermined sequence.

16 Claims, 3 Drawing Sheets

(51) Int. Cl.
  *B08B 5/02*   (2006.01)
  *B08B 7/00*   (2006.01)
  *B08B 13/00*  (2006.01)
  *C23C 14/02*  (2006.01)

(56) References Cited

U.S. PATENT DOCUMENTS

2016/0121372 A1* 5/2016 Pfau ................. B05B 12/04
                                                    134/30
2019/0009752 A1   1/2019 Rice et al.

FOREIGN PATENT DOCUMENTS

FR        3058651 A1 *  5/2018    ............. B08B 17/02
WO        2009056466 A1  5/2009

OTHER PUBLICATIONS

FR3058651 translation (Year: 2018).*
First Examination Report, Counter Indian Application No. 202117047411, Dated Feb. 2, 2023, 6 pgs.
First Office Action issued by the China National Intellectual Property Administration (English Translation Attached), dated Feb. 2, 2023, for related Chinese Application No. 202080033840.1; 8 pg.
International Search Report and Written Opinion for International patent application No. PCT/US2020/033166, filed May 15, 2020, mailed Aug. 17, 2020.

* cited by examiner

AUTOMATED VEHICLE COMPONENT CLEANING SYSTEM

CROSS-REFERENCE TO RELATED APPLICATIONS

This application is a national phase application of International Application No. PCT/US2020/033166, filed on May 15, 2020, which claims priority to U.S. Provisional Application No. 62/849,539, filed on May 17, 2019, each incorporated herein by reference in its entirety.

FIELD OF THE DISCLOSURE

The present disclosure generally relates to cleaning systems for vehicle components, and more specifically to an automated vehicle component cleaning system using a cleaning agent.

BACKGROUND OF THE DISCLOSURE

During manufacturing of a vehicle, a cleaning system is used to pre-clean one or more vehicle components of the vehicle before performing a physical vapor deposition (PVD) process. The PVD process is used to transfer a coating material at an atom or molecule level on the vehicle components and to provide pure and high-performance coatings. Such coatings are highly resistant to tarnishing and corrosion, and therefore render the vehicle components highly resistant to scratches and scrapes. Typically, the vehicle components are pre-cleaned with a cleaning liquid (e.g., water) and/or a solvent (e.g., a hydrocarbon solvent) to prepare for the PVD process. Surface roughness, texture, and component cleanliness are all critical parameters for achieving a proper PVD coating performance from an adhesion perspective. However, achieving a uniform coating thickness on the vehicle component can be difficult when the vehicle component includes a complicated geometry, such as a small bore.

Referring now to FIG. 1, during the PVD process, a coating layer 10 is applied onto an outer surface of a substrate 12 of the vehicle component. Often, even after the pre-clean process, one or more unwanted particles or other contaminants 14 can remain on the outer surface of substrate 12. For example, a pilot valve seat (PVS) of a fuel injector in the vehicle includes a small outlet opening connected to a fuel passageway. Due to complex internal geometries, unwanted particles or contaminants 14 can be trapped in the outlet opening and the fuel passageway. Trapped particles or contaminants 14 can be baked onto substrate 12 during the PVD process causing undesirable results. Various residues from the cleaning liquid, an environment (e.g., dust), and/or a rust preventative fluid may cause further accumulation of unwanted particles or contaminants 14 on the outer surface of substrate 12. Moreover, a manual handling of the vehicle component with a contaminated hand can leave the residues on the outer surface of substrate 12.

Such various contaminations may result in a poor coating adhesion between substrate 12 and coating layer 10, and cause unnecessary delays and increased operating costs during a manufacturing process of the vehicle. Accordingly, it is desirable to develop an enhanced cleaning system that eliminates or alleviates one or more operational disadvantages described above.

SUMMARY OF THE DISCLOSURE

In one embodiment, the present disclosure provides a system for performing a cleaning process of a component of a vehicle. The system includes a first cleaning applicator configured to deliver a cleaning agent to a first surface of the component of the vehicle, a second cleaning applicator configured to deliver the cleaning agent to a second surface of the component of the vehicle, a third cleaning applicator configured to deliver the cleaning agent to a third surface of the component of the vehicle, and a control unit configured to instruct the first cleaning applicator to project the cleaning agent onto the first surface of the component for a first predetermined period, the second cleaning applicator to project the cleaning agent onto the second surface of the component for a second predetermined period, and the third cleaning applicator to project the cleaning agent onto the third surface of the component for a third predetermined period. The first, second, and third applicators are instructed to project the cleaning agent in a predetermined sequence.

In another embodiment of the present disclosure, a cleaning method is provided for performing a cleaning process of a component of a vehicle. The method includes delivering a cleaning agent to a first surface of the component of the vehicle using a first cleaning applicator, delivering the cleaning agent to a second surface of the component of the vehicle using a second cleaning applicator, delivering the cleaning agent to a third surface of the component of the vehicle using a third cleaning applicator, instructing, using a processor, the first cleaning applicator to project the cleaning agent onto the first surface of the component for a first predetermined period, the second cleaning applicator to project the cleaning agent onto the second surface of the component for a second predetermined period, and the third cleaning applicator to project the cleaning agent onto the third surface of the component for a third predetermined period, and instructing the first, second, and third applicators to project the cleaning agent in a predetermined sequence.

While multiple embodiments are disclosed, still other embodiments of the present disclosure will become apparent to those skilled in the art from the following detailed description, which shows and describes illustrative embodiments of the present disclosure. Accordingly, the drawings and detailed description are to be regarded as illustrative in nature and not restrictive.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

Figure 1:
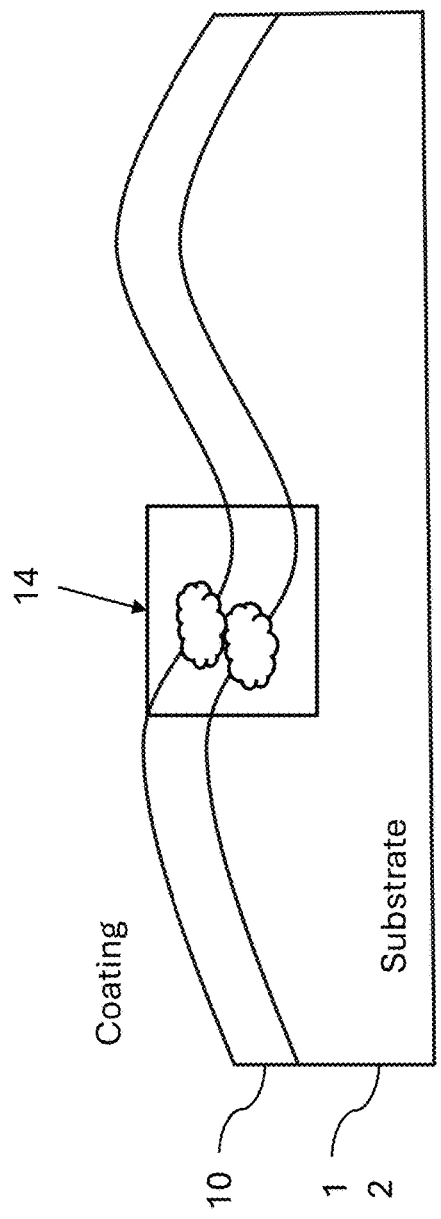
FIG. 1 is a schematic illustration of exemplary contamination on a vehicle component during a physical vapor deposition process.

While the present disclosure is amenable to various modifications and alternative forms, specific embodiments have been shown by way of example in the drawings and are described in detail below. The intention, however, is not to limit the present disclosure to the particular embodiments described. On the contrary, the present disclosure is intended to cover all modifications, equivalents, and alternatives falling within the scope of the present disclosure as defined by the appended claims.

DETAILED DESCRIPTION OF THE DISCLOSURE

In the following detailed description, reference is made to the accompanying drawings which form a part hereof, and in which is shown by way of illustration specific embodiments in which the present disclosure is practiced. These embodiments are described in sufficient detail to enable those skilled in the art to practice the present disclosure, and it is to be understood that other embodiments can be utilized and that structural changes can be made without departing from the scope of the present disclosure. Therefore, the following detailed description is not to be taken in a limiting sense, and the scope of the present disclosure is defined by the appended claims and their equivalents.

Figure 3:
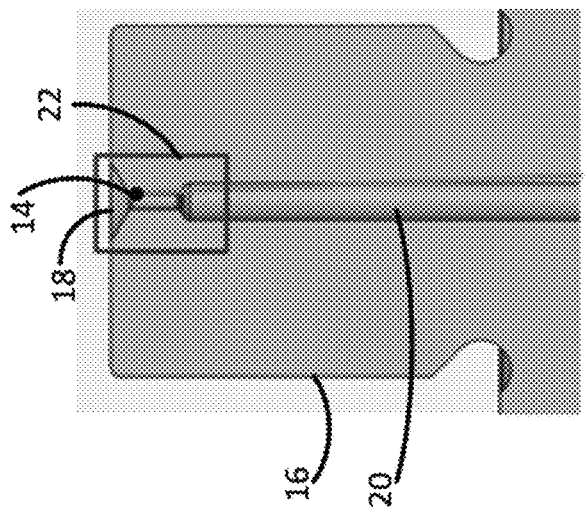
FIGS. 2 and 3 are schematic illustrations of exemplary contamination on a pilot valve seat used in a vehicle.
Figure 2:
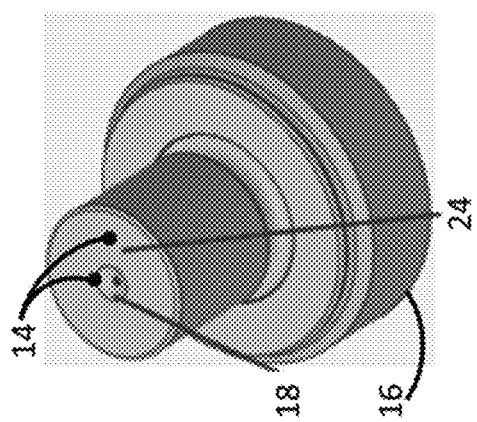

FIGS. 2 and 3 show an illustrative vehicle component, such as a solenoid seat 16 used in a vehicle (not shown). Exemplary vehicles include land mobile machines, railed vehicles, marine vehicles, aircraft, spacecraft, or any motored machines that drive forces for movement. In one example, an engine can be a fuel injection engine operated by liquid or gaseous fuel, such as gasoline, diesel, or gas (e.g., LPG). Other suitable types of engines using gaseous fuels, such as liquefied hydrogen, propane, or other pressurized fuels, are also contemplated to suit different applications. In fuel injected engines, fuel is supplied to the engine using solenoid seat 16. In one example, solenoid seat 16 can be a pilot valve seat (PVS) of a fuel injector (not shown).

In the illustrated embodiment, solenoid seat 16 of the fuel injector in the vehicle includes an outlet opening 18 connected to a fuel passageway 20 (FIG. 3). Due to complex internal geometries (or small sizes) in outlet opening 18 and fuel passageway 20, unwanted particles or contaminants 14 can be trapped in outlet opening 18 and/or fuel passageway 20. Most unwanted particles or contaminants 14 are found near an outlet portion 22 of solenoid seat 16. For example, unwanted particles or contaminants 14 can be found in or near a conical region of outlet opening 18. However, due to an uneven surface roughness or texture of an outer surface 24 (FIG. 2) of solenoid seat 16, some residual unwanted particles or contaminants 14 can also be found near outlet portion 22 of solenoid seat 16. Although solenoid seat 16 is shown for illustration purposes, any other vehicle components with complex internal or external geometries (e.g., surfaces or orifices) and/or small sizes are contemplated to suit different applications, for example, diesel vehicle components or electronic parts (e.g., a wire harness or cable assembly). Examples of such other vehicle components include tappets integrated in internal combustion engines, fuel pumps such as piston-type and plunger-type pumps, and injection plug pins or needles for use in injector nozzles, among others.

Figure 4:
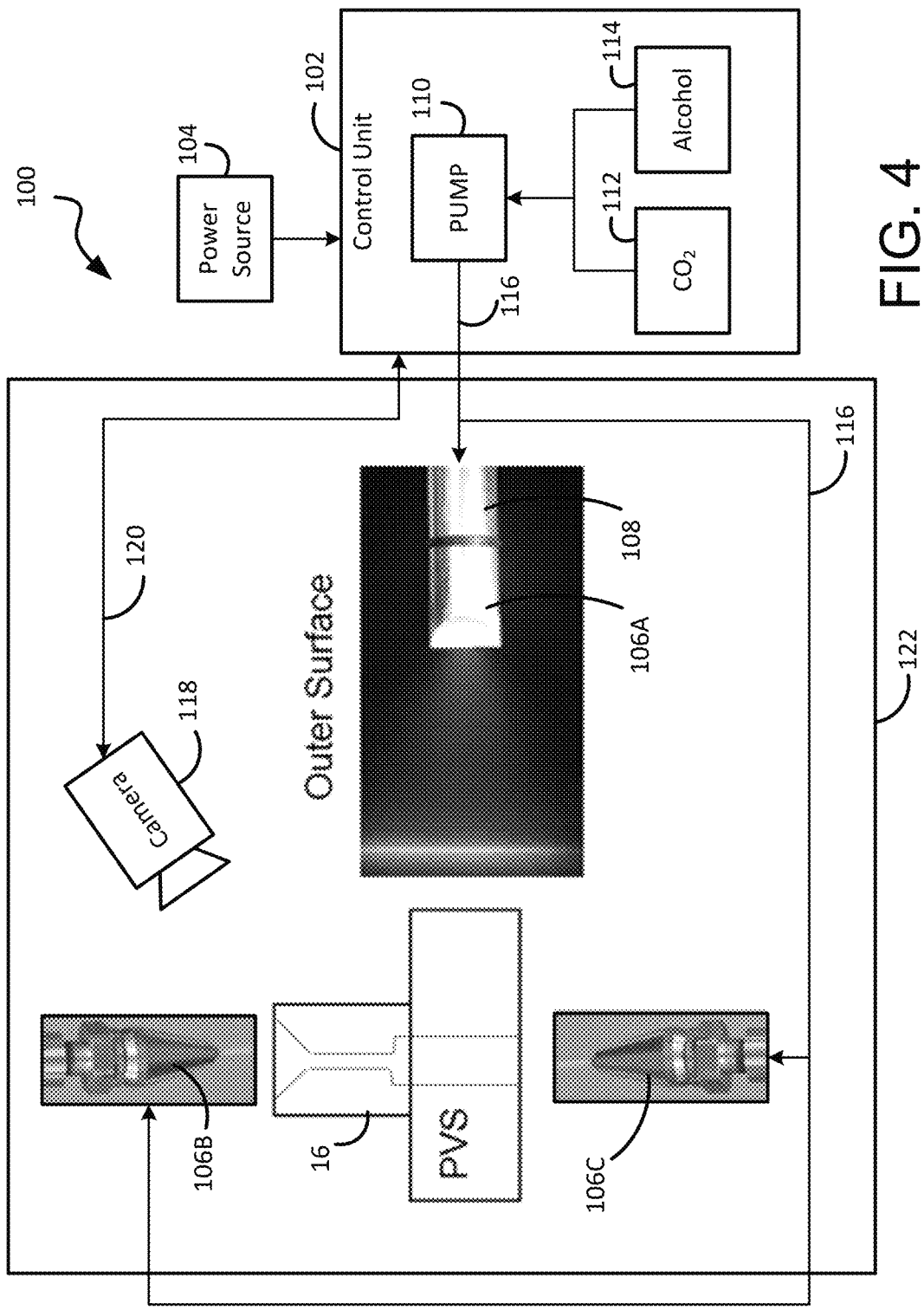
FIG. 4 is a schematic illustration of an automated vehicle component cleaning system in accordance with embodiments of the present disclosure.

FIG. 4 shows an illustrative cleaning system 100 configured to automatically clean one or more vehicle components, such as solenoid seat 16 (e.g., PVS), using a control unit 102. A power source 104, such as a battery or an electric outlet, is electrically connected to control unit 102 to deliver electric power. Control unit 102 is configured to control an overall operation of one or more cleaning nozzles or applicators 106A, 106B, 106C during a cleaning process of solenoid seat 16. Although three nozzles 106A, 106B, 106C are shown for illustration purposes, any number of nozzles is contemplated to suit the application.

In the illustrated embodiment, an annular heated jacket 108 is mounted near a distal portion of nozzle 106A to heat the distal portion of nozzle 106A to a desired temperature. Each nozzle 106A, 106B, 106C is fluidically connected to a pump 110 configured to deliver a cleaning agent, such as hot and/or pressurized air, an alcohol, or a carbon dioxide ($CO_2$). In one embodiment, a replenished $CO_2$ is selected as the cleaning agent to utilize a green technology without an application of other chemicals, such as rust preservatives.

In embodiments, the $CO_2$ is stored in a $CO_2$ reservoir or tank 112 and the alcohol is stored in an alcohol reservoir or tank 114. In one embodiment, control unit 102 instructs pump 110 to deliver the $CO_2$ from $CO_2$ tank 112 to nozzles 106A, 106B, 106C via one or more conduits 116. For example, each nozzle 106A, 106B, 106C is configured to project or spray small sized pellets of dry ice out of a corresponding nozzle together with compressed air onto an outer surface of solenoid seat 16 for cleaning. Dry ice for blasting can be produced by a controlled expansion of liquid $CO_2$ into dry ice snow or crystals. In some embodiments, additives can be added to the liquid $CO_2$ before the expansion of the liquid $CO_2$ into dry ice snow, or the additives can be sprayed onto the surfaces of dry ice snow (e.g., $CO_2$ based solvents). Although embodiments of the present disclosure are not limited to particular temperature or pressure values for maintaining the liquid $CO_2$, the liquid $CO_2$ is typically maintained at a temperature of approximately −60 degree Celsius (−60° C.) at a pressure of approximately 5.11 atmospheric pressure (approximately 0.52 MPa). The blasting or spraying of the $CO_2$ may be performed at a higher pressure than the pressure in which the pressure which the liquid $CO_2$ is maintained. Furthermore, in some examples, air may be used to clean the surface. The air may be delivered at a high pressure (for example, at a pressure that is above 5 MPa, 10 MPa, 20 MPa, or 50 MPa, etc., as suitable for the component to be cleaned) and/or a high temperature (for example, at a temperature that is above 70° C., 100° C., 150° C., or 200° C., etc., as suitable for the component to be cleaned).

A viewing device 118, such as a camera, is communicably connected to control unit 102 via a communication link 120. In one embodiment, control unit 102 is configured to monitor a progress of the cleaning process using viewing device 118 that transmits one or more images (or videos) of solenoid seat 16. In another embodiment, control unit 102 receives one or more images of the outer surface of solenoid seat 16 from viewing device 118 to detect the presence of unwanted particles or contaminants 14. Further, control unit 102 can be configured to detect a wet condition or a dry condition of the outer surface of solenoid seat 16. As such, viewing device 118 can be used by control unit 102 before, during, and after the cleaning process as desired.

In another embodiment, a protective enclosure 122 at least partially surrounds one or more of solenoid seat 16, nozzles 106A, 106B, 106C, and viewing device 118 to reduce the risk of external or cross contamination from its surrounding environment. For example, the cross contamination can be caused by various oils, fingerprints, or non-organic substances, such as debris, during the manufacturing process of the vehicle. In one embodiment, robotic arms, grippers, or actuators controlled by control unit 102 can be used in protective enclosure 122 to selectively move or operate solenoid seat 16, nozzles 106A, 106B, 106C, and viewing device 118. As such, a minimal user contact is required to avoid potential handling contamination.

Figure 5:
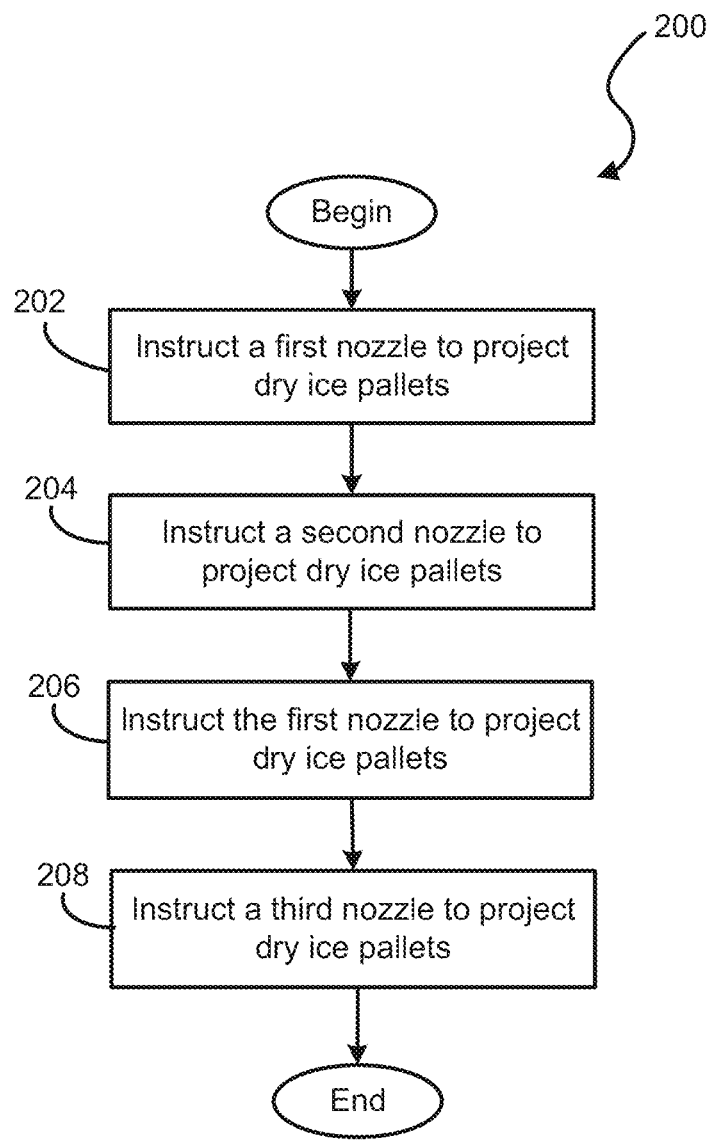
FIG. 5 is a flow chart of an exemplary cleaning process using the cleaning system of FIG. 4 in accordance with embodiments of the present disclosure.

FIG. 5 shows an exemplary cleaning process 200 using cleaning system 100. Although the following steps are primarily described with respect to the embodiments of FIGS. 1-4, it should be understood that the steps within the method may be modified and executed in a different order or sequence without altering the principles of the present disclosure. Although cleaning process 200 is shown using the $CO_2$, the process 200 can be similarly applied to another cleaning method using a different cleaning agent, such as the alcohol.

The method begins at step 202. In step 202, control unit 102 instructs a first or top nozzle 106B to project the dry ice pellets for a first predetermined period (e.g., 5-10 seconds). In one example, each nozzle 106A, 106B, 106C projects the dry ice pellets in a constant stream for 5 seconds. In another example, each nozzle 106A, 106B, 106C projects the dry ice pellets in a pulsed pattern for 10 seconds. Any combination of these projection techniques can be used to suit different applications. In one embodiment, top nozzle 106B is configured to clean an upper surface of solenoid seat 16. For example, the upper surface includes the conical region of outlet opening 18 and the outer surface 24 of solenoid seat 16 (FIG. 2). Also, the dry ice pellets can be blasted downwardly into fuel passageway 20 of solenoid seat 16 for cleaning internal portions of solenoid seat 16.

In step 204, control unit 102 instructs a second or bottom nozzle 106C to project the dry ice pellets for a second predetermined period (e.g., 5-10 seconds). Bottom nozzle 106C is configured to clean a lower surface of solenoid seat 16. Also, the dry ice pellets can be blasted upwardly into fuel passageway 20 of solenoid seat 16 for cleaning.

In step 206, control unit 102 instructs again first or top nozzle 106B to project the dry ice pellets for the first predetermined period (e.g., 5-10 seconds). Any number of repetitive projections using any of three nozzles 106A, 106B, 106C is contemplated to suit different applications.

In step 208, control unit 102 instructs a third or lateral nozzle 106A to project the dry ice pellets for a third predetermined period (e.g., 5-10 seconds). In one embodiment, lateral nozzle 106A is configured to clean a side surface of solenoid seat 16. For example, the dry ice pellets are blasted horizontally onto the side surface of solenoid seat 16 using lateral nozzle 106A. During the cleaning process, solenoid seat 16 can be rotated or moved in any desired direction using an indexing table or a robotic arm to clean all outer surfaces of solenoid seat 16. It is to be understood that the aforementioned steps in the cleaning process 200 may be applied to any combination of different surfaces including but not limited to: side surfaces, upper surfaces, lower surfaces, internal surfaces, or passageways of the component to be cleaned, for example. In some examples, the passageways (or fluid passageways) are orifices which may fluidly couple two different surfaces, such as an internal surface and an external surface.

An exemplary total duration of the cleaning process ranges between approximately 20-100 seconds depending on an amount of unwanted particles or contaminants 14 detected by viewing device 118. More specifically, the exemplary total duration is approximately 85 seconds. As described above, unwanted particles or contaminants 14 are effectively removed from solenoid seat 16 using cleaning system 100, subsequently improving the coating adhesion between substrate 12 and coating layer 10 of solenoid seat 16 during the PVD process.

The method ends at step 208 which may include a return to step 202. Any of steps 202-208 can be repeated as desired.

The above detailed description and the examples described therein have been presented for the purposes of illustration and description only and not for limitation. For example, the operations described can be done in any suitable manner. The methods can be performed in any suitable order while still providing the described operation and results. It is therefore contemplated that the present embodiments cover any and all modifications, variations, or equivalents that fall within the scope of the basic underlying principles disclosed above and claimed herein.

Embodiments of the present disclosure are described by way of example only, with reference to the accompanying drawings. Further, the following description is merely illustrative in nature and is in no way intended to limit the disclosure, its application, or uses. As used herein, the term "unit" or "module" refers to, be part of, or include an Application Specific Integrated Circuit (ASIC), an electronic circuit, a processor or microprocessor (shared, dedicated, or group) and/or memory (shared, dedicated, or group) that executes one or more software or firmware programs, a combinational logic circuit, and/or other suitable components that provide the described functionality. Thus, while this disclosure includes particular examples and arrangements of the units, the scope of the present system should not be so limited since other modifications will become apparent to the skilled practitioner.

Furthermore, while the above description describes hardware in the form of a processor executing code, hardware in the form of a state machine, or dedicated logic capable of producing the same effect, other structures are also contemplated. Each unit or component can be operated as a separate unit from control unit 102, and other suitable combinations of sub-units are contemplated to suit different applications. Also, although the units are illustratively depicted as separate units, the functions and capabilities of each unit can be implemented, combined, and used in conjunction with/into any unit or any combination of units to suit different applications.

It is to be understood that the above description is intended to be illustrative, and not restrictive. Many other embodiments will be apparent to those of skill in the art upon reading and understanding the above description. For example, it is contemplated that features described in association with one embodiment are optionally employed in addition or as an alternative to features described in associate with another embodiment. The scope of the present disclosure should, therefore, be determined with reference to the appended claims, along with the full scope of equivalents to which such claims are entitled.

What is claimed is:

1. A cleaning system for performing a cleaning process of a component of a vehicle, comprising:
   a viewing device to capture one or more images of the component of the vehicle;
   an actuator to selectively move the component of the vehicle in one or more directions;
   a first cleaning applicator configured to deliver a cleaning agent to a first surface of the component of the vehicle;
   a second cleaning applicator configured to deliver the cleaning agent to a second surface of the component of the vehicle;
   a third cleaning applicator configured to deliver the cleaning agent to a third surface of the component of the vehicle; and
   a control unit configured to instruct the first cleaning applicator to project the cleaning agent onto the first surface of the component for a first predetermined period, the second cleaning applicator to project the cleaning agent onto the second surface of the component for a second predetermined period, and the third cleaning applicator to project the cleaning agent onto the third surface of the component for a third predetermined period, the first, second, and third applicators being instructed to project the cleaning agent in a predetermined sequence, wherein the viewing device is communicably coupled to the control unit and configured to receive the one or more images of the component of the vehicle, and wherein the control unit is configured to control the viewing device and the actuator during the cleaning process by rotating the actuator in a desired direction to clean outer surfaces of the component.

2. The cleaning system of claim 1, wherein the cleaning agent is air, carbon dioxide, or alcohol.

3. The cleaning system of claim 1, wherein each of the first surface, the second surface, and the third surface corresponds to any one of: a side surface, an upper surface, a lower surface, an internal surface, or a passageway of the component.

4. The cleaning system of claim 1, wherein the component is any one of: a valve seat, a tappet, a plunger, or an injector needle of a fuel injector in the vehicle.

5. The cleaning system of claim 1, the control unit further comprising a pump configured to deliver the cleaning agent to the first, second, and third cleaning applicators.

6. The cleaning system of claim 5, wherein the pump is configured to deliver the cleaning agent at a pressure of above 5 MPa, 10 MPa, 20 MPa, or 50 MPa.

7. The cleaning system of claim 5, wherein the pump is configured to deliver the cleaning agent at a temperature of above 70° C., 100° C., 150° C., or 200° C.

8. The cleaning system of claim 5, wherein the cleaning agent includes air, alcohol, or carbon dioxide, and the control unit is configured to select whether the air, the alcohol, or the carbon dioxide is to be delivered by the pump.

9. The cleaning system of claim 8, wherein the carbon dioxide is liquid carbon dioxide which may transform into dry ice snow or crystals when delivered to any one of the first, second, and third surfaces of the component.

10. The cleaning system of claim 1, wherein the control unit is configured to control the viewing device and the actuator by selectively moving the viewing device to detect the presence of unwanted particles or contaminants and to detect a wet condition or a dry condition of the component of the vehicle.

11. A method for performing a cleaning process of a component of a vehicle, comprising:

capturing, with a viewing device, one or more images of the component of the vehicle;

selectively moving the component of the vehicle in one or more directions with an actuator;

delivering a cleaning agent to a first surface of the component of the vehicle using a first cleaning applicator;

delivering the cleaning agent to a second surface of the component of the vehicle using a second cleaning applicator;

delivering the cleaning agent to a third surface of the component of the vehicle using a third cleaning applicator; and instructing, via a control unit, the first cleaning applicator to project the cleaning agent onto the first surface of the component for a first predetermined period, the second cleaning applicator to project the cleaning agent onto the second surface of the component for a second predetermined period, and the third cleaning applicator to project the cleaning agent onto the third surface of the component for a third predetermined period, and further instructing the first, second, and third applicators to project the cleaning agent in a predetermined sequence, wherein the viewing device is communicably coupled to the control unit and configured to receive the one or more images of the component of the vehicle, and wherein the control unit is configured to control the viewing device and the actuator during the cleaning process by rotating the actuator in a desired direction to clean outer surfaces of the component.

12. The method of claim 11, wherein each of the first surface, the second surface, and the third surface corresponds to any one of: a side surface, an upper surface, a lower surface, an internal surface, or a passageway of the component.

13. The method of claim 11, wherein the component is any one of: a valve seat, a tappet, a plunger, or an injector needle of a fuel injector in the vehicle.

14. The method of claim 11, further comprising: delivering, by a pump operatively coupled to the control unit, the cleaning agent to the first, second, and third cleaning applicators.

15. The method of claim 14, wherein the cleaning agent includes air, alcohol, and carbon dioxide, the method further comprising: selecting, by the control unit, whether the air, the alcohol, or the carbon dioxide is to be delivered by the pump.

16. The method of claim 15, wherein the carbon dioxide is liquid carbon dioxide which may transform into dry ice snow or crystals when delivered to any one of the first, second, and third surfaces of the component.

\* \* \* \* \*